United States Patent
Kimura

(10) Patent No.: US 11,430,815 B2
(45) Date of Patent: Aug. 30, 2022

(54) METAL WIRING FILM AND METHOD OF FABRICATING THEREOF, THIN FILM TRANSISTOR

(71) Applicant: Wuhan China Star Optoelectronics Semiconductor Display Technology Co., LTD., Hubei (CN)

(72) Inventor: Toru Kimura, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 90 days.

(21) Appl. No.: 16/631,203

(22) PCT Filed: Sep. 17, 2019

(86) PCT No.: PCT/CN2019/106132
§ 371 (c)(1),
(2) Date: Oct. 29, 2020

(87) PCT Pub. No.: WO2020/215595
PCT Pub. Date: Oct. 29, 2020

(65) Prior Publication Data
US 2021/0242243 A1    Aug. 5, 2021

(30) Foreign Application Priority Data
Apr. 22, 2019  (CN) .......................... 201910321838.3

(51) Int. Cl.
*H01L 27/12*    (2006.01)
(52) U.S. Cl.
CPC ........ *H01L 27/124* (2013.01); *H01L 27/1259* (2013.01)

(58) Field of Classification Search
None
See application file for complete search history.

(56) References Cited

U.S. PATENT DOCUMENTS

2012/0133271 A1   5/2012  Hirai
2012/0223300 A1*  9/2012  Kang .................. H01L 29/45
                                                              438/34
2015/0185887 A1   7/2015  Park et al.

FOREIGN PATENT DOCUMENTS

| CN | 102925753 A | 2/2013 |
| CN | 103855214 A | 6/2014 |

(Continued)

OTHER PUBLICATIONS

Machine-generated English translation of JP 2012160381, total pp. 7 (Year: 2012).*

(Continued)

*Primary Examiner* — Bo B Jang
(74) *Attorney, Agent, or Firm* — Benesch, Friedlander, Coplan & Aronoff, LLP

(57) ABSTRACT

A metal wiring film, a method for fabricating the same, and a thin film transistor. The metal wiring film includes: a first film layer formed by a nickel-copper alloy, a mass percentage of nickel in the nickel-copper alloy ranges from 30% to 70%; a second film layer disposed above the first film layer, a material forming the second film layer is an aluminum-neodymium alloy, and the mass percentage of neodymium in the aluminum-neodymium alloy ranges from 1% to 5%; a third film layer disposed above the second film layer, a material forming the third film layer is the same as the material forming the first film layer.

18 Claims, 1 Drawing Sheet

(56) References Cited

FOREIGN PATENT DOCUMENTS

| | | |
|---|---|---|
| CN | 205406523 U | 7/2016 |
| CN | 107204320 A | 9/2017 |
| CN | 110085602 A | 8/2019 |
| JP | 2012160381 A | 8/2012 |

OTHER PUBLICATIONS

Machine-generated English translation of CN 102925753, total pp. 6 (Year: 2013).*
Matt Hughes, "What is DC Sputtering?," 2016, Semicore, total pp. 3 (Year: 2016).*

* cited by examiner

METAL WIRING FILM AND METHOD OF FABRICATING THEREOF, THIN FILM TRANSISTOR

CROSS REFERENCE TO RELATED APPLICATION

This application claims the priority of International Application No. PCT/CN2019/106132, filed on 2019 Sep. 17, which claims priority to Chinese Application No. 201910321838.3, filed on 2019 Apr. 22. The entire disclosures of each of the above applications are incorporated herein by reference.

BACKGROUND OF INVENTION

Field of Invention

The present invention relates to the field of electronic display, and in particular, to a metal wiring film and a method of fabricating thereof, a thin film transistor.

Description of Prior Art

To achieve transparent display, a common practice in the prior art is to use transparent conductive films to form traces in thin film transistors of a display screen. The traces in a conventional display panel generally include an indium tin oxide film (ITO) and a metal wiring film covering the ITO film. The metal wiring film generally includes two layers of molybdenum-niobium alloy film (Mo—Nb) and an aluminum-niobium alloy Al—Nb film located between them.

Technical Problems

Because unit impedance of the molybdenum-niobium alloy and unit impedance of the aluminum-niobium alloy differ greatly, thereby a potential difference exists between the aluminum-niobium alloy and the aluminum-niobium alloy on both sides thereof. The existence of this potential difference causes the aluminum alloy film to be electrolytically corroded, thereby destroying integrity of protective film. At the same time, electrical resistance of the metal wiring film is increased and quality of the display panel is affected.

SUMMARY OF INVENTION

The present application provides a metal wiring film, a method of fabricating thereof, and a thin film transistor to eliminate a potential difference in a metal wiring film and prevent the metal wiring film from being electrolytically corroded.

Specifically, the present application provides a metal wiring film, wherein the metal wiring film comprises:
a first film layer formed by a nickel-copper alloy, a mass percentage of nickel in the nickel-copper alloy ranges from 30% to 70%;
a second film layer disposed above the first film layer, a material forming the second film layer is an aluminum-neodymium alloy, and the mass percentage of neodymium in the aluminum-neodymium alloy ranges from 1% to 5%;
a third film layer disposed above the second film layer, a material forming the third film layer is the same as the material forming the first film layer.

According to one aspect of the application, wherein the nickel-copper alloy further comprises metallic titanium, and a mass percentage of titanium in the nickel-copper alloy is between 1% and 10%.

According to one aspect of the application, wherein the nickel-copper alloy has a mass percentage of nickel of 30%, a mass percentage of copper of 60%, and a mass percentage of titanium of 10%.

According to one aspect of the application, wherein a mass percentage of neodymium in the aluminum-neodymium alloy is 1%.

According to one aspect of the application, wherein the first film layer and the third film layer have a same thickness, and a thickness of the second film layer is greater than or equal to twice the sum of a thicknesses of the first film layer and the third film layer.

According to one aspect of the application, wherein a thickness of the first film layer and the third film layer is between 20 and 60 nm, a thickness of the second film layer is between 200 and 250 nm.

The present application further provides a thin film transistor comprising a metal wiring film, wherein the metal wiring film comprises:
a first film layer formed by a nickel-copper alloy, a mass percentage of nickel in the nickel-copper alloy ranges from 30% to 70%;
a second film layer disposed above the first film layer, a material forming the second film layer is an aluminum-neodymium alloy, and the mass percentage of neodymium in the aluminum-neodymium alloy ranges from 1% to 5%;
a third film layer disposed above the second film layer, a material forming the third film layer is the same as the material forming the first film layer.

According to one aspect of the application, wherein the nickel-copper alloy further comprises metallic titanium, and a mass percentage of titanium in the nickel-copper alloy is between 1% and 10%.

According to one aspect of the application, wherein the nickel-copper alloy has a mass percentage of nickel of 30%, a mass percentage of copper of 60%, and a mass percentage of titanium of 10%.

According to one aspect of the application, wherein a mass percentage of neodymium in the aluminum-neodymium alloy is 1%.

According to one aspect of the application, wherein the first film layer and the third film layer have a same thickness, and a thickness of the second film layer is greater than or equal to twice the sum of a thicknesses of the first film layer and the third film layer.

According to one aspect of the application, wherein a thickness of the first film layer and the third film layer is between 20 and 60 nm, a thickness of the second film layer is between 200 and 250 nm.

The present application further provides a method of fabricating a metal wiring film in a thin film transistor, wherein the method comprises the following steps:
providing a substrate, the substrate comprising an active region and an insulating layer covering the active region;
forming a transparent conductive film on the insulating layer;
forming a first film layer covering the transparent conductive film, the material of the first film layer is a nickel-copper alloy, and a mass percentage of nickel in the nickel-copper alloy is between 30% and 70%;
forming a second film layer above the first film layer, the material of the second film layer is an aluminum-neodymium alloy, and a mass percentage of neodymium in the aluminum-neodymium alloy is between 1% and 5%;

forming a third film layer over the second film layer, the material of the third film layer is same as the material of the first film layer.

According to one aspect of the application, wherein the method of forming the first film layer and the third film layer is:

providing a vacuum chamber, the pressure of the vacuum chamber is less than or equal to $4 \times 10^{-5}$ Pa;

pouring argon into the vacuum chamber such that the pressure in the vacuum chamber is between 0.2 and 1 Pa;

using a nickel-copper alloy film as a target of a direct current sputtering method to form a nickel-copper alloy film having a thickness ranging from 20 to 60 nm.

According to one aspect of the application, wherein the method of forming the second film layer is:

providing a vacuum chamber, the pressure of the vacuum chamber is less than or equal to $4 \times 10^{-5}$ Pa;

pouring argon into the vacuum chamber such that the pressure in the vacuum chamber is between 0.2 and 1 Pa;

forming an aluminum-neodymium alloy film having a thickness ranging from 200 to 250 nm by a direct current sputtering method using an aluminum-neodymium alloy as a target.

Beneficial Effects

The present application uses a nickel-copper alloy instead of a molybdenum-niobium alloy in the prior art to form a first film layer and a third film layer in a metal wiring film, using an aluminum-neodymium alloy instead of an aluminum-niobium alloy in the prior art to form a second film layer, and by setting thicknesses of the films, a thickness of the second film layer is greater than or equal to twice the sum of the thicknesses of the first film layer and the third film layer. Thereby, potential difference between the respective film layers is effectively eliminated, and the metal wiring film is prevented from being electrolytically corroded.

DETAILED DESCRIPTION OF PREFERRED EMBODIMENTS

Figure 1:
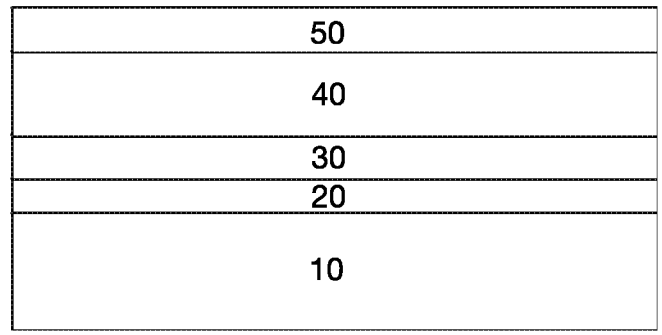
FIG. 1 is a structural diagram of a metal wiring film in a specific embodiment of the present application.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art will be briefly described. The traces in a conventional display panel generally include an indium tin oxide film (ITO) and a metal wiring film covering the ITO film. The metal wiring film generally includes two layers of molybdenum-niobium alloy film (Mo—Nb) and an aluminum-niobium alloy Al—Nb film located between them.

Because unit impedance of the molybdenum-niobium alloy and unit impedance of the aluminum-niobium alloy differ greatly, thereby a potential difference exists between the aluminum-niobium alloy and the aluminum-niobium alloy on both sides thereof. The existence of this potential difference causes the aluminum alloy film to be electrolytically corroded, thereby destroying integrity of protective film. At the same time, electrical resistance of the metal wiring film is increased and quality of the display panel is affected.

To solve the above problems, the present application provides a metal wiring film, a method of fabricating thereof, and a thin film transistor to eliminate a potential difference in a metal wiring film and prevent the metal wiring film from being electrolytically corroded.

Referring to FIG. 1, the metal wiring film is disposed on an ITO film 20, and the ITO film 20 is disposed on a substrate 10. Specifically, the metal wiring film includes a first film layer 30, a second film layer 40, and a third film layer 50.

In the present embodiment, the first film layer 30 formed by a nickel-copper alloy, a mass percentage of nickel in the nickel-copper alloy ranges from 30% to 70%. Copper and nickel can infinitely solid solute to form a continuous solid solution. Therefore, regardless of a ratio of copper to nickel, the nickel-copper alloy is always a single-phase alloy. At the same time, adding nickel to copper can significantly increase the strength, corrosion resistance, hardness, electrical resistance and pyroelectricity of copper and reduce a temperature coefficient of electrical resistivity. Therefore, in order to enhance a conductivity of the metal wiring film, it is preferable that the mass percentage of nickel in the nickel-copper alloy is 40% or 50%.

Titanium has low density, high mechanical strength and corrosion resistance and extremely ductility, therefore, adding titanium to the nickel-copper alloy can effectively suppress the generation of hot cracks and pores. In this embodiment, in order to make the metal wiring film have better ductility, the nickel-copper alloy further includes titanium. The mass percentage of titanium in the nickel-copper alloy is between 1% and 10%, such as 5% or 8%. Preferably, the nickel-copper alloy has a mass percentage of nickel of 30%, a mass percentage of copper of 60%, and a mass percentage of titanium of 10%. In other embodiments, manganese can also be used instead of titanium metal to achieve a similar effect.

The second film layer 40 is disposed on the first film layer 30, and the material forming the second film layer 40 is an aluminum-neodymium alloy. Compared with the aluminum-niobium alloy, the aluminum-neodymium alloy has better corrosion resistance and can prevent the metal aluminum in the second film layer 40 from being electrolytically corroded due to the potential difference between the film layers. Preferably, the mass percentage of neodymium in the aluminum-neodymium alloy is between 1% and 5%, such as 1%, 1.5% or 2.5%.

In the present embodiment, the third film layer 50 disposed above the second film layer, a material forming the third film layer is the same as the material forming the first film layer. That is, material and thickness of the third film layer 50 are the same as those of the first film layer 30 to avoid a potential difference between the first film layer 30 and the third film layer 50 generated by resistance difference, thus the metal wiring film is prevented from being electrolytically corroded. Therefore, in the present embodiment, the material forming the first film layer 30 is also a nickel-copper alloy, and a mass percentage of nickel in the nickel-copper alloy is between 30% and 70%. In order to enhance the conductivity of the metal wiring film, the mass percentage of nickel in the nickel-copper alloy is 40% or 50%.

In this embodiment, thickness of the first film layer 30 and thickness of the third film layer 50 range from 20 and 60 nm. Preferably, the thickness of the first film layer 30 and the thickness of the third film layer 50 is 50 nm. The thickness of the second film layer 40 is greater than or equal to twice the thicknesses of the first film layer 30 and the third film layer 50, that is, the thickness of the second film layer 40 is between 200 and 250 nm. In this embodiment, the thickness of the second film layer 40 is 240 nm.

Accordingly, the present application also provides a thin film transistor. Referring to FIG. 1, the thin film transistor includes a substrate 10, an ITO film 20 on the substrate 10, and a metal wiring film on the ITO film 20. The metal wiring film includes a first film layer 30, a second film layer 40, and a third film layer 50 which are laminated. The materials and structures of the respective film layers are as described above, and are not described herein again.

Figure 2:
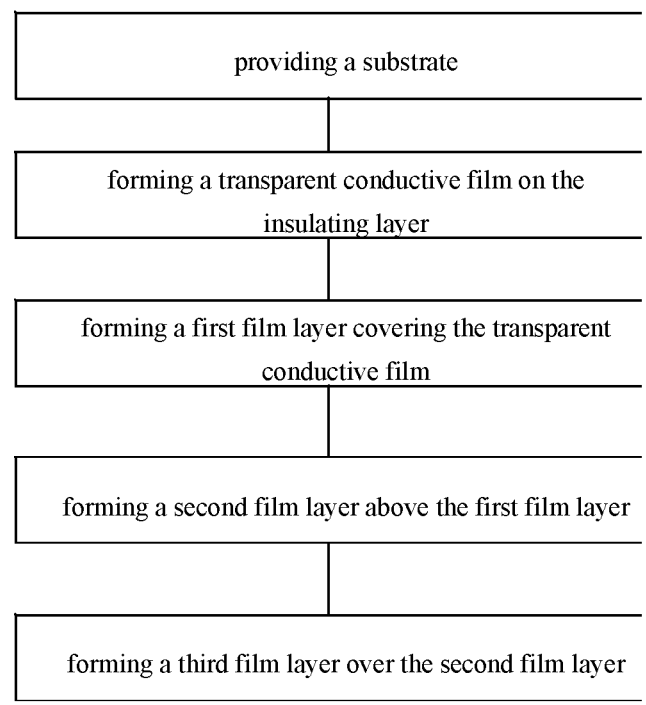
FIG. 2 is a flow chart of a method of fabricating a metal wiring film in an embodiment of the present application.

Correspondingly, the present application also provides a method for fabricating a metal wiring film in a thin film transistor. Referring to FIG. 2, the method includes the following steps:

providing a substrate 10;

forming a transparent conductive film 20 on the substrate 10;

forming a first film layer 30 covering the transparent conductive film;

forming a second film layer 40 above the first film layer 30;

forming a third film layer 50 on the second film layer 40.

The above steps will be described in detail below.

In this embodiment, the substrate 10 includes an active region and an insulating layer covering the active region. The active region includes a channel region and source/drain regions on both sides of the channel region. Additionally, the active region further includes a gate stack covering the channel region, the gate stack including a gate dielectric layer and a gate metal layer covering the gate dielectric layer. The gate stack and the source/drain regions are covered by an interlayer dielectric layer. The interlayer dielectric layer has via holes exposing the source/drain regions.

Thereafter, a transparent conductive film 20 is formed on the substrate 10. Wherein at least a portion of the transparent conductive film 20 is electrically connected to the source/drain regions through the via holes.

Thereafter, a first film layer 30 covering the transparent conductive film 20 is formed, and the material of the first film layer 30 is a nickel-copper alloy, and the mass percentage of nickel in the nickel-copper alloy is between 30% and 70%.

In the present embodiment, the first film layer 30 formed by a nickel-copper alloy, a mass percentage of nickel in the nickel-copper alloy ranges from 30% to 70%. Copper and nickel can infinitely solid solute to form a continuous solid solution. Therefore, regardless of a ratio of copper to nickel, the nickel-copper alloy is always a single-phase alloy. At the same time, adding nickel to copper can significantly increase the strength, corrosion resistance, hardness, electrical resistance and pyroelectricity of copper and reduce a temperature coefficient of electrical resistivity. Therefore, in order to enhance conductivity of the metal wiring film, it is preferable that the mass percentage of nickel in the nickel-copper alloy is 40% or 50%.

Titanium has a low density, high mechanical strength and corrosion resistance and extremely ductility, therefore, adding titanium to the nickel-copper alloy can effectively suppress the generation of hot cracks and pores. In this embodiment, in order to make the metal wiring film have better ductility, the nickel-copper alloy further includes titanium. The mass percentage of titanium in the nickel-copper alloy is between 1% and 10%, such as 5% or 8%. Preferably, the nickel-copper alloy has a mass percentage of nickel of 30%, a mass percentage of copper of 60%, and a mass percentage of titanium of 10%. In other embodiments, manganese can also be used instead of titanium metal to achieve a similar effect.

The method of forming the first film layer 30 includes providing a vacuum chamber, the pressure of the vacuum chamber is less than or equal to $4 \times 10^{-5}$ Pa. then pouring argon into the vacuum chamber such that the pressure in the vacuum chamber is between 0.2 and 1 Pa. Then using a nickel-copper alloy film as a target of a direct current sputtering method to form a nickel-copper alloy film having a thickness ranging from 20 to 60 nm. In this embodiment, the thickness of the first film layer 30 is between 20 and 60 nm. Preferably, the thickness of the first film layer 30 is 50 nm.

Thereafter, a second film layer 40 is formed above the first film layer 30. The material forming the second film layer 40 is an aluminum-neodymium alloy. Compared with the aluminum-niobium alloy, the aluminum-neodymium alloy has better corrosion resistance and can prevent the metal aluminum in the second film layer 40 from being electrolytically corroded due to the potential difference between the film layers. Preferably, the mass percentage of neodymium in the aluminum-neodymium alloy is between 1% and 5%, such as 1%, 1.5% or 2.5%.

The method of forming the second film layer includes providing a vacuum chamber, the pressure of the vacuum chamber is less than or equal to $4 \times 10^{-5}$ Pa. Then pouring argon into the vacuum chamber such that the pressure in the vacuum chamber is between 0.2 and 1 Pa. Then forming an aluminum-neodymium alloy film having a thickness ranging from 200 to 250 nm by a direct current sputtering method using an aluminum-neodymium alloy as a target. In this embodiment, the thickness of the second film layer 40 is between 200 and 260 nm. Preferably, the thickness of the second film layer 40 is 240 nm.

In the present embodiment, material and thickness of the third film layer 50 are the same as those of the first film layer 30 to avoid a potential difference between the first film layer 30 and the third film layer 50 generated by resistance difference, thus the metal wiring film is prevented from being electrolytically corroded. Therefore, in the present embodiment, the material forming the first film layer 30 is also a nickel-copper alloy, and a mass percentage of nickel in the nickel-copper alloy is between 30% and 70%. In order to enhance the conductivity of the metal wiring film, the mass percentage of nickel in the nickel-copper alloy is 40% or 50%. Preferably, the nickel-copper alloy has a mass percentage of nickel of 30%, a mass percentage of copper of 60%, and a mass percentage of titanium of 10%. In other embodiments, manganese can also be used instead of titanium metal to achieve a similar effect.

The method of forming the third film layer 50 is the same as the method of forming the first film layer 30, and details are not described herein again.

Because unit impedance of the molybdenum-niobium alloy and unit impedance of the aluminum-niobium alloy differ greatly, thereby a potential difference exists between the aluminum-niobium alloy and the aluminum-niobium alloy on both sides thereof. The existence of this potential difference causes the aluminum alloy film to be electrolytically corroded, thereby destroying integrity of protective film. At the same time, electrical resistance of the metal wiring film is increased and quality of the display panel is affected.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A metal wiring film, wherein the metal wiring film comprises:
   a first film layer formed by a nickel-copper alloy, wherein a mass percentage of nickel in the nickel-copper alloy ranges from 30% to 70%, the nickel-copper alloy further comprises metallic titanium, and a mass percentage of titanium in the nickel-copper alloy ranges from 1% to 10%;
   a second film layer disposed above the first film layer, wherein a material forming the second film layer is an aluminum-neodymium alloy, and a mass percentage of neodymium in the aluminum-neodymium alloy ranges from 1% to 5%; and
   a third film layer disposed above the second film layer, wherein a material forming the third film layer is same as the material forming the first film layer.

2. The metal wiring film according to claim 1, wherein the mass percentage of titanium in the nickel-copper alloy ranges from 5% to 10%.

3. The metal wiring film according to claim 2, wherein the nickel-copper alloy has the mass percentage of nickel of 30%, a mass percentage of copper of 60%, and the mass percentage of titanium of 10%.

4. The metal wiring film according to claim 1, wherein the mass percentage of neodymium in the aluminum-neodymium alloy is 1%.

5. The metal wiring film according to claim 1, wherein the first film layer and the third film layer have a same thickness, and a thickness of the second film layer is greater than or equal to twice a sum of the thicknesses of the first film layer and the third film layer.

6. The metal wiring film according to claim 5, wherein a thickness of each of the first film layer and the third film layer ranges from 20 to 60 nm, and the thickness of the second film layer ranges from 200 to 250 nm.

7. The metal wiring film according to claim 1, wherein the mass percentage of nickel in the nickel-copper alloy ranges from 30% to 40%.

8. A thin film transistor comprising a metal wiring film, wherein the metal wiring film comprises:
   a first film layer formed by a nickel-copper alloy, wherein a mass percentage of nickel in the nickel-copper alloy ranges from 30% to 70%, the nickel-copper alloy further comprises metallic titanium, and a mass percentage of titanium in the nickel-copper alloy ranges from 1% to 10%;
   a second film layer disposed above the first film layer, wherein a material forming the second film layer is an aluminum-neodymium alloy, and a mass percentage of neodymium in the aluminum-neodymium alloy ranges from 1% to 5%; and
   a third film layer disposed above the second film layer, wherein a material forming the third film layer is same as the material forming the first film layer.

9. The thin film transistor according to claim 8, wherein the mass percentage of titanium in the nickel-copper alloy ranges from 5% to 10%.

10. The thin film transistor according to claim 9, wherein the nickel-copper alloy has the mass percentage of nickel of 30%, a mass percentage of copper of 60%, and the mass percentage of titanium of 10%.

11. The thin film transistor according to claim 8, wherein the mass percentage of neodymium in the aluminum-neodymium alloy is 1%.

12. The thin film transistor according to claim 8, wherein the first film layer and the third film layer have a same thickness, and a thickness of the second film layer is greater than or equal to twice a sum of the thicknesses of the first film layer and the third film layer.

13. The thin film transistor according to claim 12, wherein a thickness of each of the first film layer and the third film layer ranges from 20 to 60 nm, and the thickness of the second film layer ranges from 200 to 250 nm.

14. The thin film transistor according to claim 8, wherein the mass percentage of nickel in the nickel-copper alloy ranges from 30% to 40%.

15. A method of fabricating a metal wiring film in a thin film transistor, wherein the method comprises the following steps:
   providing a substrate, wherein the substrate comprises an active region and an insulating layer covering the active region;
   forming a transparent conductive film on the insulating layer;
   forming a first film layer covering the transparent conductive film, wherein a material of the first film layer is a nickel-copper alloy, a mass percentage of nickel in the nickel-copper alloy ranges from 30% to 70%, the nickel-copper alloy further comprises metallic titanium, and a mass percentage of titanium in the nickel-copper alloy ranges from 1% to 10%;
   forming a second film layer above the first film layer, wherein a material of the second film layer is an aluminum-neodymium alloy, and a mass percentage of neodymium in the aluminum-neodymium alloy ranges from 1% to 5%; and
   forming a third film layer over the second film layer, wherein a material of the third film layer is same as the material of the first film layer.

16. The method of fabricating the metal wiring film according to claim 15, wherein the steps of forming the first film layer and forming the third film layer are:
   providing a vacuum chamber, wherein a pressure of the vacuum chamber is less than or equal to $4 \times 10^{-5}$ Pa;
   pouring argon into the vacuum chamber such that a pressure in the vacuum chamber ranges from 0.2 to 1 Pa; and
   taking a nickel-copper alloy material as a target of a direct current sputtering method to form a nickel-copper alloy film having a thickness ranging from 20 to 60 nm.

17. The method of fabricating the metal wiring film according to claim 15, wherein the step of forming the second film layer is:
   providing a vacuum chamber, wherein a pressure of the vacuum chamber is less than or equal to $4 \times 10^{-5}$ Pa;
   pouring argon into the vacuum chamber such that a pressure in the vacuum chamber ranges from 0.2 to 1 Pa; and forming an aluminum-neodymium alloy film having a thickness ranging from 200 to 250 nm by a direct current sputtering method using an aluminum-neodymium material as a target.

18. The method of fabricating the metal wiring film according to claim 15, wherein the mass percentage of nickel in the nickel-copper alloy ranges from 30% to 40%.

* * * * *